United States Patent
Hillman et al.

(10) Patent No.: US 6,455,414 B1
(45) Date of Patent: Sep. 24, 2002

(54) METHOD FOR IMPROVING THE ADHESION OF SPUTTERED COPPER FILMS TO CVD TRANSITION METAL BASED UNDERLAYERS

(75) Inventors: Joseph T. Hillman, Scottsdale, AZ (US); Cory S. Wajda, Mesa, AZ (US); Steven P. Caliendo, Gold Canyon, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/723,878

(22) Filed: Nov. 28, 2000

(51) Int. Cl.[7] ............................................. H01L 21/44
(52) U.S. Cl. ...................................................... 438/628
(58) Field of Search ................................. 438/627, 628

(56) References Cited

U.S. PATENT DOCUMENTS 5,919,531 A * 7/1999 Arkles et al. ............... 427/576
5,989,999 A 11/1999 Levine et al. ............... 438/627
6,221,792 B1 * 4/2001 Yang et al. .................. 438/776

* cited by examiner

Primary Examiner—Richard Elms
Assistant Examiner—Beth E. Owens
(74) Attorney, Agent, or Firm—Wood, Herron & Evans, LLP

(57) ABSTRACT

A method for improving adhesion of copper films to transition metal based barrier layers. Tantalum or other transition metal based barrier layers are deposited by chemical vapor deposition techniques using transition metal halide precursor materials which generate halogen atom impurities in the barrier layer. The barrier layer is treated with a plasma generated from a nitrogen-containing gas, such as ammonia. Halogen impurity levels are thereby decreased at the surface of the barrier layer. On this surface is subsequently applied a copper film by physical vapor deposition. The copper film exhibits improved adherence to the barrier layer.

26 Claims, 3 Drawing Sheets

METHOD FOR IMPROVING THE ADHESION OF SPUTTERED COPPER FILMS TO CVD TRANSITION METAL BASED UNDERLAYERS

CROSS REFERENCE TO RELATED APPLICATIONS

This application is related to copending U.S. patent application Ser. No. 09/723,876 filed Nov. 28, 2000 entitled METHOD FOR PRETREATING DIELECTRIC LAYERS TO ENHANCE THE ADHESION OF CVD METAL LAYERS THERETO; U.S. patent application Ser. No. 09/300,165 filed Apr. 27, 1999 entitled CVD TiN PLUG FORMATION FROM TITANIUM HALIDE PRECURSORS; U.S. patent application Ser. No. 09/300,658, now U.S. Pat. No. 6,265,311, entitled PECVD OF TaN FILMS FROM TANTALUM HALIDE PRECURSORS; U.S. patent application Ser. No. 09/300,661 filed Apr. 27, 1999 entitled THERMAL CVD OF TaN FILMS FROM TANTALUM HALIDE PRECURSORS; U.S. patent application Ser. No. 09/300,583 filed Apr. 27, 1999 entitled PECVD OF Ta FILMS FROM TANTALUM HALIDE PRECURSORS; U.S. patent application Ser. No. 09/300,659, now U.S. Pat. No. 6,268,288, and entitled PLASMA TREATED THERMAL CVD OF TaN FILMS FROM TANTALUM HALIDE PRECURSORS; and U.S. patent application Ser. No. 09/300,632 filed Apr. 27, 1999 entitled CVD OF INTEGRATED TaN AND $TaN_x$ FILMS FROM TANTALUM HALIDE PRECURSORS.

FIELD OF THE INVENTION

This invention relates to adhesion of copper films to transition metal based underlayers in the manufacture of semiconductor devices.

BACKGROUND OF THE INVENTION

The semiconductor industry is committed to introducing copper interconnects as a replacement for conventional aluminum and aluminum alloy interconnects in future generations of semiconductor devices. With its greater current carrying capacity, the introduction of copper interconnects should reduce device geometry, power consumption and heat generation. However, copper is a fast diffuser in silicon and drifts in dielectrics, resulting in a deterioration of devices at low temperatures. To avoid unwanted migration of copper atoms, a barrier layer or underlayer of a transition metal-based material, such as a tantalum-based material and more particularly tantalum or tantalum nitride, is typically used as a diffusion barrier between a copper interconnect layer and an underlying dielectric layer, such as a layer of silicon oxide. One method of providing the diffusion barrier is physical vapor deposition (PVD) by sputtering. However, sputter deposition, among other problems, cannot adequately cover the sidewalls of near-surface features having a high aspect ratio because sputtering is essentially a line-of-sight deposition process.

Two chemical vapor deposition (CVD) processes, thermal CVD and plasma-enhanced CVD (PECVD), are candidates to replace PVD. CVD provides highly uniform layers that conform to topographical features having high aspect ratios. Thermal CVD is a high temperature process in which a flow of gaseous reactants over a heated semiconductor substrate chemically react to deposit a solid layer on the heated substrate. Plasma-enhanced CVD is a relatively low-temperature process which introduces a plasma to activate the gaseous reactants.

To deposit a transition metal-based barrier layer, both CVD processes react a vapor-phase reactant, for example a transition metal halide reagent such as a tantalum halide or titanium halide, with a reducing gas, for example a hydrogen-containing gas such as either hydrogen ($H_2$) or ammonia ($NH_3$). If, for example, the reducing gas is hydrogen and the vapor-phase reactant is a tantalum halide, tantalum (Ta) is deposited, while tantalum nitride ($TaN_x$) is deposited if the reducing gas is a nitrogen-containing gas, such as ammonia or a mixture of nitrogen and hydrogen.

The chemical reduction of the transition metal halide vapor-phase reactant produces halogen atoms as a by-product. The layer of transition metal-based material deposited by either of the CVD methods using a gas mixture comprising a transition metal halide vapor-phase reactant will incorporate a low residual level of the by-product halogen atoms as an unwanted impurity. For example, a layer of tantalum deposited on a substrate by plasma-enhanced CVD using, for example, tantalum pentafluoride will usually contain an average of about 0.5 atomic percent of the residual halide, in this instance the residual halide being fluorine. Residual fluorine concentration may peak, however, near interfaces, in particular the barrier/dielectric interface and the barrier/copper interface.

An elevated concentration of halogen atoms present at the barrier/dielectric interface has been found to correlate with a significantly reduced adhesion of the transition metal-based layer to the underlying dielectric. Likewise, elevated halogen atom concentration at the barrier/copper interface has been found to correlate with reduced adhesion of copper to the transition metal-based layer. Halogen atoms significantly disrupt the atomic bonding at the interfaces between the transition metal-based layer and the dielectric or copper film so that the transition metal-based layer and the overlying copper layer are more likely to delaminate. A nitrogen-containing plasma pretreatment of the dielectric surface prior to CVD of the barrier layer has been proposed in copending application Ser. No. 09/723,876 entitled METHOD FOR PRETREATING DIELECTRIC LAYERS TO ENHANCE THE ADHESION OF CVD METAL LAYERS THERETO filed on even date herewith. The pretreatment provides nitrogen at the interface, which improves adhesion of a subsequently applied barrier layer. While this pretreatment is effective in improving adhesion at the barrier/dielectric interface, further improvement in adhesion is desirable at the barrier/copper interface.

There is thus a need for a CVD method that will prevent residual halogen impurities from altering the adhesion of a copper film deposited on a transition metal-based barrier layer deposited by a CVD process on a dielectric-covered substrate.

SUMMARY OF THE INVENTION

The present invention provides a method for improving the adhesion of copper films to transition metal based barrier underlayers. To this end, and in accordance with the present invention, transition metal based barrier underlayers are deposited by chemical vapor deposition using transition metal halide precursors. In one example of the present invention, a modulated $Ta/TaN_x$ underlayer is deposited using a tantalum pentafluoride precursor. The chemical reaction using these precursors generates halogen impurity atoms in the barrier layer. The barrier layer is consequently treated with a plasma generated from a nitrogen-containing gas, such as ammonia. The plasma post-treatment of the barrier layer reduces halogen impurity levels at the surface.

Following the post-treatment, the copper film is deposited onto the treated barrier layer by physical vapor deposition. Due to the decreased halogen impurity level at the copper film/barrier layer interface, the copper film exhibits good adhesion to the barrier underlayer.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the principles of the invention.

DETAILED DESCRIPTION

Refractory transition metals such as tantalum (Ta) or titanium (Ti) and their nitride films (TaN or TiN) are effective diffusion barriers to copper (Cu). Their effectiveness is due to their high thermal stability, high conductivity and resistance to diffusion of foreign elements or impurities. Ta and TaN are especially attractive due to their chemical inertness with Cu; no compounds form between Cu and Ta or Cu and N.

Tantalum halides provide a convenient inorganic source for CVD of Ta and TaN barrier layers. Specifically, the inorganic precursor is a tantalum pentahalide (TaX$_5$) where X represents the halides fluorine (F), chlorine (Cl) and bromine (Br). For CVD of Ti and TiN barrier layers, titanium halides are typically chosen, such as titanium tetrahalides (TiX$_4$). In chemical vapor deposition (CVD) processes, the gas precursors are activated using either thermal energy or electrical energy. Upon activation, the gas precursors react chemically to form a film. During this process, however, halogen atoms generated during reaction of the precursor are incorporated into the deposited film, with increased levels at film interfaces. The increased halogen atom content at the interface between the barrier layer and copper film may result in copper delamination. Thus, the present invention provides a CVD post-treatment of the barrier layer to improve adhesion of subsequently deposited copper.

To this end, and in accordance with the present invention, CVD methods are used to deposit a barrier underlayer. This barrier layer may be a modulated Ta/TaN barrier layer, a modulated Ti/TiN barrier layer, or any other suitable transition metal-based layer or layers. The barrier layer is then exposed within the CVD chamber to a nitrogen-containing plasma, for example an ammonia plasma. The nitrogen-containing plasma reacts with halogen atoms trapped near the surface of the barrier layer and effectively carries them away. This plasma post-treatment is even more effective when the nitrogen-containing plasma further includes hydrogen gas, such as with ammonia or N$_2$+H$_2$. After this post-treatment, the substrate is transferred to a PVD module and the copper film is deposited onto the plasma-treated barrier layer.

Figure 1:
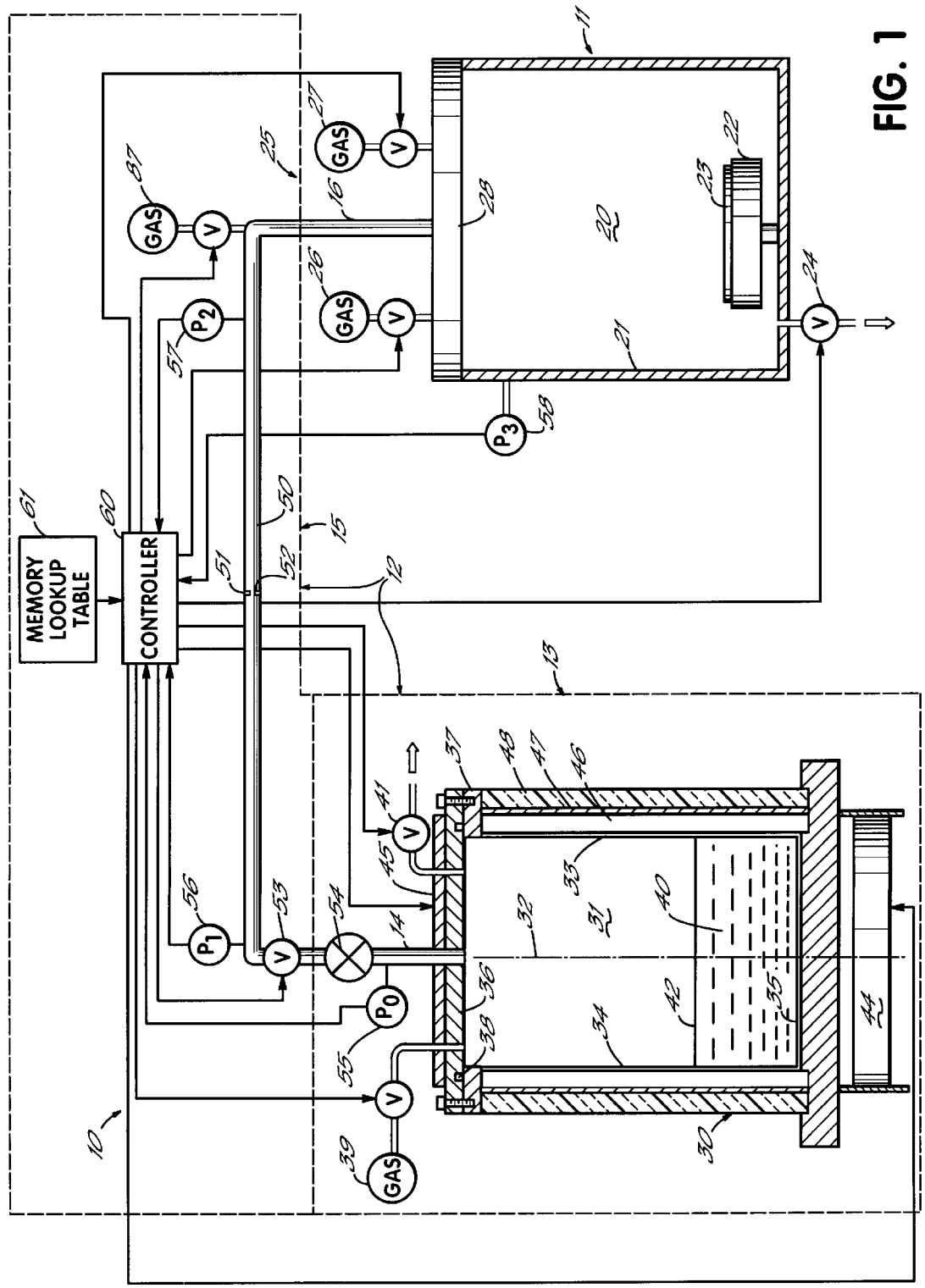
FIG. 1 is a side view, partially in cross-section, of a reactor used to practice the method of the present invention.

FIG. 1 depicts a chemical vapor deposition (CVD) system 10 that may be used in the present invention. System 10 includes a CVD reaction chamber 11 and a precursor delivery system 12. The particular embodiment of system 10 shown herein is provided only to illustrate operation of the invention and should not be used to limit the scope of the invention. In the reaction chamber 11, a reaction is carried out to convert a precursor gas of, for example, tantalum pentafluoride (TaF$_5$) or other tantalum halide compound, into a film such as a barrier layer film of tantalum (Ta) and/or tantalum nitride (TaN$_x$). The TaN film is not limited to any particular stoichiometry (TaN$_x$) because TaN$_x$ can be continuously varied by changing the ratio of the gases in any given deposition. Thus, as used herein, TaN$_x$ encompasses a tantalum nitride film of any stoichiometry.

The precursor delivery system 12 includes a source 13 of precursor gas having a gas outlet 14, which communicates through a metering system 15 with a gas inlet 16 to the CVD reaction chamber 11. The source 13 generates a precursor vapor, for example a tantalum halide vapor, from a tantalum halide compound. The compound is one that is in a solid state when at standard temperature and pressure. The precursor source is maintained, preferably by controlled heating, at a temperature that will produce a desired vapor pressure of precursor. Preferably, the vapor pressure is one that is itself sufficient to deliver the precursor vapor to the reaction chamber 11, preferably without the use of a carrier gas. The metering system 15 maintains a flow of the precursor gas vapor from the source 13 into the reaction chamber 11 at a rate that is sufficient to maintain a commercially viable CVD process in the reaction chamber 11.

The reaction chamber 11 is a generally conventional CVD reactor and includes a vacuum chamber 20 that is bounded by a vacuum tight chamber wall 21. In the chamber 20 is situated a substrate support or susceptor 22 on which a substrate such as a semiconductor wafer 23 is supported. The chamber 20 is maintained at a vacuum appropriate for the performance of a CVD reaction that will deposit a film such as a modulated Ta/TaN$_x$ barrier layer on the semiconductor wafer substrate 23. A preferred pressure range for the CVD reaction chamber 11 is in the range of from 0.2–5.0 Torr. The vacuum is maintained by controlled operation of a vacuum pump 24 and of inlet gas sources 25 that include the delivery system 12 and may also include reducing gas sources 26 of, for example, hydrogen (H$_2$), nitrogen (N$_2$) or ammonia (NH$_3$) for use in carrying out a tantalum reduction reaction, and an inert gas source 27 for a gas such as argon (Ar) or helium (He). The gases from the sources 25 enter the chamber 20 through a showerhead 28 that is situated at one end of the chamber 20 opposite the substrate 23, generally parallel to and facing the substrate 23.

The precursor gas source 13 includes a sealed evaporator 30 that includes a cylindrical evaporation vessel 31 having a vertically oriented axis 32. The vessel 31 is bounded by a cylindrical wall 33 formed of a high temperature tolerant and non-corrosive material such as the alloy INCONEL™ 600, the inside surface 34 of which is highly polished and smooth. The wall 33 has a flat circular closed bottom 35 and an open top, which. is sealed by a cover 36 of the same heat tolerant and non-corrosive material as the wall 33. The outlet 14 of the source 13 is situated in the cover 36. When high temperatures are used, such as with TaBr$_5$, the cover 36 is sealed to a flange ring 37 that is integral to the top of the wall 33 by a high temperature tolerant vacuum compatible metal seal 38 such as a HELICOFLEX™ seal, which is formed of a C-shaped nickel tube surrounding an INCONEL™ coil spring. With materials requiring lower temperatures, such as TaCl$_5$ and TaF$_5$, a conventional elastomeric O-ring seal 38 may be used to seal the cover.

Connected to the vessel 31 through the cover 36 is a source 39 of a carrier gas, which is preferably an inert gas such as He or Ar. The source 13 includes a mass of precursor material such as tantalum fluoride, chloride or bromide (TaX$_n$), preferably as the pentahalide (TaX$_5$), at the bottom of the vessel 31, which is loaded into the vessel 31 at standard temperature and pressure in a solid state. The vessel 31 is filled with tantalum halide vapor by sealing the vessel 31 with the solid mass of TaX$_n$ therein. The halide is supplied as a precursor mass 40 that is placed at the bottom of the vessel 31, where it is heated, preferably to a liquid state as long as the resulting vapor pressure is in an acceptable range. Purge gas and TaX$_n$ vapors are, however, first evacuated from the vessel with a vacuum pump 41 so that only TaX$_n$ vapor from the TaX$_n$ mass 40 remains in the vessel 31. Where the mass 40 is liquid, the vapor lies above the level of the liquid mass 40. Because wall 33 is a vertical cylinder, the surface area of TaX$_n$ mass 40, if a liquid, remains constant regardless of the level of depletion of the TaX$_n$.

The delivery system 12 is not limited to direct delivery of a precursor 40 but can be used in the alternative for delivery of precursor 40 along with a carrier gas, which can be introduced into the vessel 31 from gas source 39. Such a gas may be hydrogen (H$_2$) or an inert gas such as helium (He) or argon (Ar). Where a carrier gas is used, it may be introduced into the vessel 31 so as to distribute across the top surface of the precursor mass 40 or may be introduced into the vessel 31 so as to percolate through the mass 40 from the bottom 35 of the vessel 31 with upward diffusion in order to achieve maximum surface area exposure of the mass 40 to the carrier gas. Yet another alternative is to vaporize a liquid that is in the vessel 31. However, such alternatives add undesired particulates and do not provide the controlled delivery rate achieved by the direct delivery of the precursor, that is, delivery without the use of a carrier gas. Therefore, direct delivery of the precursor is preferred.

Where it is desirable to introduce the precursor into the reaction chamber 11 through the showerhead 28 along with a carrier gas, it is preferred that the carrier gas be introduced into tube 50 near its outlet end, from a source 87 connected downstream of the downstream pressure sensor 57 of the metering system 15 so that it does not interfere with the accurate flow rate delivery of direct precursor delivery that is preferred with the system 10.

To maintain the temperature of the precursor 40 in the vessel 31, the bottom 35 of the wall 33 is maintained in thermal communication with a heater 44, which maintains the precursor 40 at a controlled temperature, preferably above its melting point, that will produce a vapor pressure of greater than about 3 Torr in the absence of a carrier gas (i.e., a direct delivery system), and a lower vapor pressure such as about 1 Torr when a carrier gas is used. The exact vapor pressure depends upon other variables such as the quantity of carrier gas, the surface area of the substrate 23, and so on. In a direct delivery system for tantalum, a vapor pressure can be maintained at the preferred pressure of 5 Torr or above by heating the a tantalum halide precursor in the 83° C. to 218° C. range. For TaX$_5$, the desired temperature is about 83° C.–95° C., for example about 95° C. for TaF$_5$; the desired temperature is about 130° C.–150° C., for example about 145° C. for TaCl$_5$; and the desired temperature is about 202° C.–218° C., for example about 205° C. for TaBr$_5$. The melting points of the respective fluoride, chloride and bromide tantalum pentahalide compounds are in the 97° C. to 265° C. range. Temperatures should not be so high as to cause premature reaction of the gases in the showerhead 28 or otherwise before contacting the wafer 23.

For purposes of example, a temperature of 180° C. is assumed to be the control temperature for the heating of the bottom 35 of the vessel 31. Given this temperature at the bottom 35 of the vessel 31, to prevent condensation of the precursor vapor on the walls 33 and cover 36 of the vessel 31, the cover is maintained at a higher temperature than the heater 44 at the bottom 35 of the wall 33 of, for example, 190° C., by a separately controlled heater 45 that is in thermal contact with the outside of the cover 36. The sides of the vessel wall 33 are surrounded by an annular trapped air space 46, which is contained between the vessel wall 33 and a surrounding concentric outer aluminum wall or can 47. The can 47 is further surrounded by an annular layer of silicon foam insulation 48. This temperature maintaining arrangement maintains the vapor in a volume of the vessel 31 bounded by the cover 36, the sides of the walls 33 and the surface 42 of the precursor mass 40 in the desired example temperature range of between 180° C. and 190° C. and the pressure greater than about 3 Torr, preferably at greater than 5 Torr. The temperature that is appropriate to maintain the desired pressure will vary with the precursor material, which is primarily contemplated as a being a tantalum or titanium halide compound.

The vapor flow metering system 15 includes a delivery tube 50 of at least ½ inch in diameter, or at least 10 millimeters inside diameter, and preferably larger so as to provide no appreciable pressure drop at the flow rate desired, which is at least approximately 2 to 40 standard cubic centimeters per minute (sccm). The tube 50 extends from the precursor gas source 13 to which it connects at its upstream end to the outlet 14, to the reaction chamber 11 to which it connects at its downstream end to the inlet 16. The entire length of the tube 50 from the evaporator outlet 14 to the reactor inlet 16 and the showerhead 28 of the reaction chamber 11 are also preferably heated to above the evaporation temperature of the precursor material 40, for example, to 195° C.

In the tube 50 is provided baffle plate 51 in which is centered a circular orifice 52, which preferably has a diameter of approximately 0.089 inches. The pressure drop from gauge 1 56 to gauge 2 57 is regulated by control valve 53. This pressure drop after control valve 53 through orifice 52 and into reaction chamber 11 is greater than about 10 milliTorr and will be proportional to the flow rate. A shut-off valve 54 is provided in the line 50 between the outlet 14 of the evaporator 13 and the control valve 53 to close the vessel 31 of the evaporator 13.

Pressure sensors 55–58 are provided in the system 10 to provide information to a controller 60 for use in controlling the system 10, including controlling the flow rate of precursor gas from the delivery system 15 into the chamber 20 of the CVD reaction chamber 11. The pressure sensors include sensor 55 connected to the tube 50 between the outlet 14 of the evaporator 13 and the shut-off valve 54 to monitor the pressure in the evaporation vessel 31. A pressure sensor 56 is connected to the tube 50 between the control valve 53 and the baffle 51 to monitor the pressure upstream of the orifice 52, while a pressure sensor 57 is connected to the tube 50 between the baffle 51 and the reactor inlet 16 to monitor the pressure downstream of the orifice 52. A further pressure sensor 58 is connected to the chamber 20 of the reaction chamber 11 to monitor the pressure in the CVD chamber 20.

Control of the flow of precursor vapor into the CVD chamber 20 of the reaction chamber 11 is achieved by the controller 60 in response to the pressures sensed by the sensors 55–58, particularly the sensors 56 and 57 which determine the pressure drop across the orifice 52. When the conditions are such that the flow of precursor vapor through the orifice 52 is unchoked flow, the actual flow of precursor vapor through the tube 52 is a function of the pressures monitored by pressure sensors 56 and 57, and can be determined from the ratio of the pressure measured by sensor 56 on the upstream side of the orifice 52, to the pressure measured by sensor 57 on the downstream side of the orifice 52.

When the conditions are such that the flow of precursor vapor through the orifice 52 is choked flow, the actual flow of precursor vapor through the tube 52 is a function of only the pressure monitored by pressure sensor 57. In either case, the existence of choked or unchoked flow can be determined by the controller 60 by interpreting the process conditions. When the determination is made by the controller 60, the flow rate of precursor gas can be determined by the controller 60 through calculation.

Preferably, accurate determination of the actual flow rate of precursor gas is calculated by retrieving flow rate data from lookup or multiplier tables stored in a non-volatile memory 61 accessible by the controller 60. When the actual flow rate of the precursor vapor is determined, the desired flow rate can be maintained by a closed loop feedback control of one or more of the variable orifice control valve 53, the CVD chamber pressure through evacuation pump 24 or control of reducing or inert gases from sources 26 and 27, or by control of the temperature and vapor pressure of the precursor gas in vessel 31 by control of heaters 44, 45.

A parallel plate RF discharge is used where the driven electrode is the gas delivery showerhead and the susceptor 22 or stage for the wafer or substrate 23 is the RF ground. The selected $TaX_5$ vapor is combined with other process gases such as $H_2$ above the substrate, which is heated to a temperature between about 300° C.–500° C. Ar and He may also be used, either singularly or in combination, as process gases in addition to H2.

Process conditions for deposition of good quality PECVD Ta films are given in Table 1, where slm is standard liters per minute and $W/cm^2$ is watts per centimeter squared.

TABLE 1

| | |
|---|---|
| Substrate Temperature | 300° C.–500° C. |
| $TaX_5$ temperature | 95° C. ($TaF_5$), 145° C. ($TaCl_5$), 205° C. ($TaBr_5$) |
| $TaX_5$ flow | 1–50 sccm |
| $H_2$ flow | 1–10 slm |
| Ar, He flow | 0–10 slm |
| Process Pressure | 0.2–5.0 Torr |
| RF Power | 0.1–5.0 $W/cm^2$ |

Process conditions for deposition of good quality PECVD $TaN_x$ films are given in Table 2.

TABLE 2

| | |
|---|---|
| Substrate Temperature | 300° C.–500° C. |
| $TaX_5$ temperature | 95° C. ($TaF_5$), 145° C. ($TaCl_5$), 205° C. ($TaBr_5$) |
| $TaX_5$ flow | 1–50 sccm |
| $H_2$ flow | 1–10 slm |
| $N_2$ flow | 0.1–10 slm |
| Ar, He flow | 0–10 slm |

TABLE 2-continued

| | |
|---|---|
| Substrate Temperature | 300° C.–500° C. |
| Process Pressure | 0.2–5.0 Torr |
| RF Power | 0.1–5.0 $W/cm^2$ |

Process conditions for deposition of good quality thermal CVD $TaN_x$ films are given in Table 3.

TABLE 3

| | |
|---|---|
| Substrate Temperature | 300° C.–500° C. |
| $TaX_5$ temperature | 95° C. ($TaF_5$), 145° C. ($TaCl_5$), 205° C. ($TaBr_5$) |
| $TaX_5$ flow | 1–50 sccm |
| $H_2$ flow | 0–10 slm |
| Ar, He flow | 0–10 slm |
| Process Pressure | 0.2–5.0 Torr |
| $NH_3$ flow | 0.1–10 slm |
| $N_2$ flow | 0–10 slm |

The thickness of the deposited barrier layer is sufficient to prevent diffusion of copper from the copper interconnect film into the oxide during subsequent high temperature processing. The usual thickness of the diffusion barrier, effective for preventing copper diffusion without altering the character of the interconnect, is between about 10 nm and about 40 nm.

The integrated films deposited by the above methods display characteristics important to the formation of an IC. There is a good smooth interface and good adhesion between the Ta and $TaN_x$ layers. The film is in the range of low enough electrical resistivity for low interconnect impedances (less than 1000 $\mu\Omega$cm and preferably less than 500 $\mu\Omega$cm), and the film has good conformality and good step coverage (greater than 0.3). Also, the deposition rates are sufficient for throughput considerations (greater than 100 Å/min) and the process uses a low wafer temperature (less than 450° C.) and thus is compatible with other thin film materials used within the device including materials with dielectric constants lower than that of $SiO_2$.

A barrier layer of modulated Ta/$TaN_x$ deposited by CVD using a transition metal halide as a vapor-phase reactant will also incorporate a concentration of by-product halogen atoms as an impurity. For the above described CVD process using tantalum pentafluoride as the vapor-phase reactant, the residual level of fluorine is less than about 2 atomic percent, and typically about 0.5 atomic percent. This residual halide impurity decreases the adherence of a subsequently applied PVD copper layer to the barrier layer.

In accordance with the present invention, the nitrogen-based post-treatment is applied to the barrier layer prior to copper deposition. The post-treatment comprises heating the substrate 23 having the barrier layer thereon to a predetermined temperature and exposing the barrier layer to a plasma excited from a nitrogen-containing process gas as provided within reaction chamber 11. The parameters for the nitrogen-containing plasma post-treatment are a substrate temperature ranging between about 150° C. to about 500° C., for example about 350° C.; a nitrogen-containing process gas flow rate of between about 50 sccm to about 10,000 sccm, for example about 2000 sccm; a reducing gas flow rate ranging from about 0 sccm to about 10,000 sccm, for example about 2000 sccm of hydrogen; an inert gas flow rate from about 0 sccm to about 2000 sccm, for example about 200 sccm of argon; a reactor pressure ranging from about 0.2 Torr to about 20 Torr, for example about 2 Torr; and an RF power ranging from about 50 Watts to about 2500 Watts, for example about 250 Watts. The process time of post-treatment effective for enhancing the adhesion of the subsequently applied copper layer to the post-treated barrier surface ranges from about 10 seconds to about 600 seconds, for example about 60 seconds of plasma exposure. The conditions for the plasma treatment are summarized in Table 4:

TABLE 4

|  | Minimum Value | Maximum Value | Exemplary Value |
|---|---|---|---|
| Temperature (° C.) | 150 | 500 | 350 |
| Ammonia Flow (sccm) | 50 | 10000 | 2000 |
| Hydrogen Flow (sccm) | 0 | 10000 | 2000 |
| Argon Flow (sccm) | 0 | 2000 | 200 |
| Total Pressure (Torr) | 0.2 | 20 | 2 |
| RF Power (W) | 50 | 2500 | 250 |
| Time (sec.) | 10 | 600 | 60 |

The plasma post-treatment is performed usually in the same reactor in which the modulated barrier layer was previously deposited by a CVD process.

The nitrogen-containing process gas can be, for example, ammonia, nitrogen, hydrazine, or any other nitrogen-containing gas. The reducing gas can be hydrogen, for example. However, the flow of reducing gas can be eliminated, particularly where the nitrogen-containing process gas also comprises hydrogen, such as occurs if the nitrogen-containing process gas is ammonia. Furthermore, the flow of inert gas, such as argon or xenon, is optional for the function of aiding in plasma initiation and maintenance and can be eliminated if that function is not needed. The inclusion of hydrogen in the post-treatment gas atmosphere can further reduce the effects of by-product halogen atoms.

Comparative Example

A dielectric-covered (SiO$_2$) silicon substrate was loaded into a CVD system similar to system 10 and preheated in a gaseous atmosphere of ammonia (NH$_3$) and hydrogen to a temperature of about 350° C. The ammonia and hydrogen each flowed into the reactor at a rate of 2 slm such that the reactor pressure was maintained at about 2 Torr. Argon flowed into the reactor at a rate of about 200 sccm. After a predetermined exposure time of about 45 seconds, the substrate was exposed to a plasma generated from the ammonia (NH$_3$) and hydrogen process gas. For this plasma pretreatment, reactor conditions further included an RF power of about 250 Watts at a frequency of about 13.6 MHz. After a predetermined exposure time of about 1 minute, the reactor was evacuated.

A tantalum nitride layer having a nominal thickness of 5 nm was then deposited by thermal CVD using tantalum pentafluoride as a vapor-phase reactant and ammonia as a process gas. Deposition conditions for the tantalum nitride layer included a substrate temperature of about 350° C.; a tantalum pentafluoride flow rate of about 10 sccm; an ammonia flow rate of about 0.5 slm; a hydrogen flow rate of about 1.5 slm; an argon flow rate of about 200 sccm; and a reactor vacuum pressure of about 2 Torr.

A tantalum layer having a nominal thickness of 5 nm was then deposited onto the tantalum nitride layer by plasma-enhanced CVD using tantalum pentafluoride as a vapor-phase reactant and hydrogen as a reducing gas. Deposition conditions for the tantalum layer included a substrate temperature of about 350° C.; a tantalum pentafluoride flow rate of about 30 sccm; a hydrogen flow rate of about 1.5 slm; an argon flow rate of about 200 sccm; a reactor vacuum pressure of about 2 Torr; and an RF power of about 250 Watts at a frequency of about 13.6 MHz.

Tantalum nitride deposition was then repeated under the conditions described above to deposit a second TaN layer of 5 nm nominal thickness. Finally, tantalum deposition was repeated under the conditions described above to deposit a final Ta layer of 5 nm nominal thickness. The final film stack produced is thus a 20 nm TaN/Ta/TaN/Ta barrier.

Immediately following the Ta/TaN barrier deposition, the substrate was transported to a copper PVD module via a conventional vacuum wafer handler. Therein, 1000 Å copper was deposited by ionized PVD using a pure copper sputter target (99.999% pure metallic copper). Deposition conditions for the copper film included a wafer temperature of 5° C., a DC power of 8 kW, and ICP power of 3.5 kW, a substrate bias of 50 Watts, an argon flow of 60 sccm, and a pressure of 65 mTorr.

Figure 2:
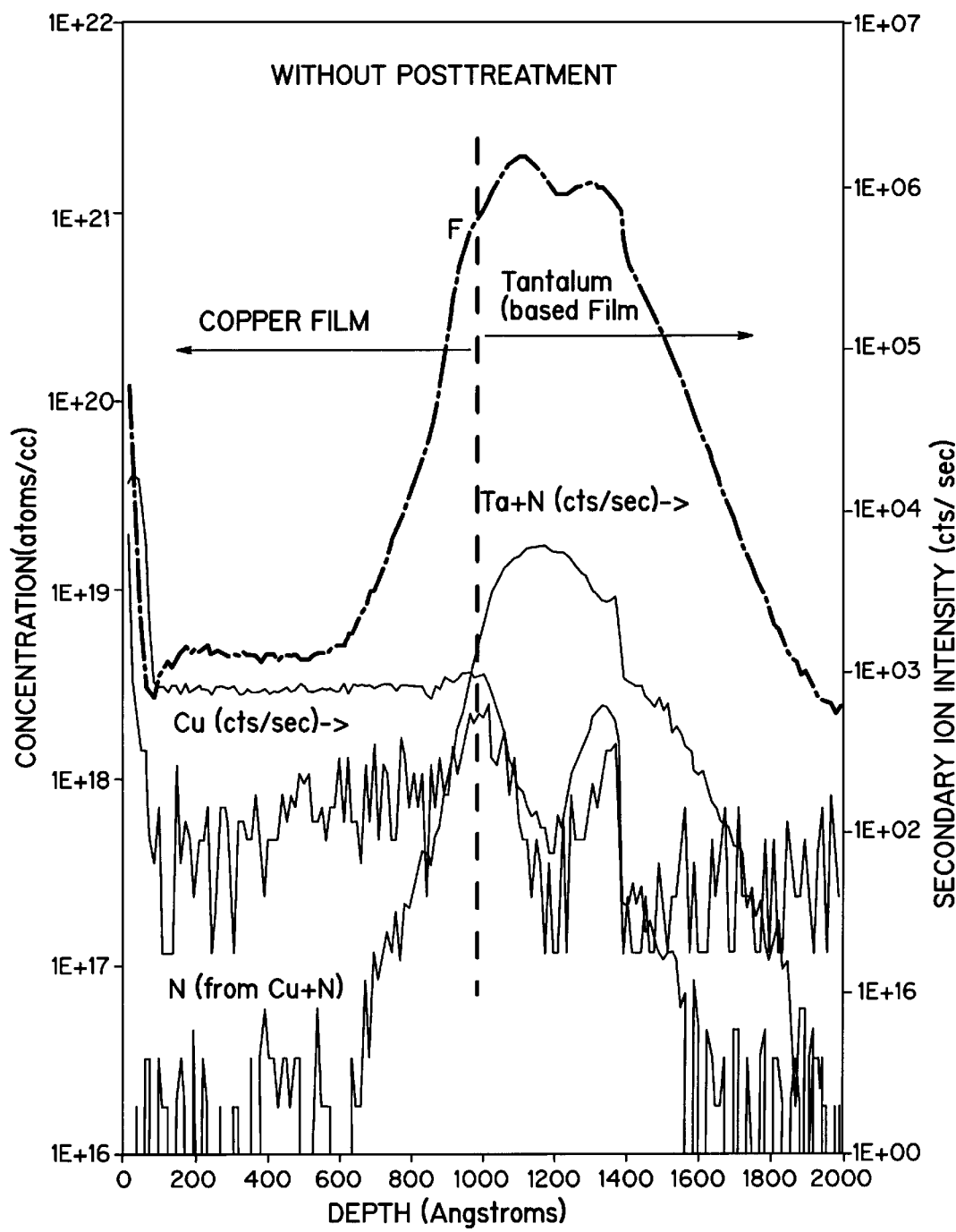
FIG. 2 is a SIMS depth profile of a copper layer deposited on a modulated tantalum/tantalum nitride film with no pretreatment of the modulated film.

FIG. 2 shows a SIMS elemental depth profile for this copper film on the modulated Ta/TaN barrier layer. Fluorine is present in the modulated barrier layer at an average level of about 4 atomic percent. Near the tantalum/copper interface, fluorine exhibits a peak concentration. The first 1000 Å at the left of the profile is the copper film. The fluorine from the CVD-Ta(N) film at the right-hand side of the graph extends into the copper film. High fluorine content at the interface is known to contribute to poor adhesion. This device did in fact exhibit poor copper adhesion. The device passed a tape test, but failed a scratch and tape test. The tape test is performed by placing a length of scotch tape on the film stack and then pulling it off. If any of the film is removed by the tape, then it is judged to fail the adhesion test. This tape test is a common test for measuring the adhesion of paints and other coatings. For the scratch and tape test, the film is first scratched with a diamond scribe in a checker-board pattern. The tape is applied and removed. This is a more severe test than the tape test alone.

Test Example

According to an embodiment of the present invention including a nitrogen-containing plasma post-treatment of the barrier layer, the same conditions set forth in the comparative example were followed for the dielectric preheat and plasma exposure, tantalum deposition and tantalum nitride deposition. Immediately following the Ta/TaN barrier layer formation, the barrier layer was post-treated in a gaseous atmosphere of ammonia (NH$_3$) and hydrogen at a temperature of about 350° C. The ammonia and hydrogen each flowed into the reactor at a rate of 2 slm such that the reactor pressure was maintained at about 2 Torr. Argon flowed into the reactor at a rate of about 200 sccm. After a predetermined exposure time of about 45 seconds, the barrier layer was exposed to a plasma generated from the ammonia (NH$_3$) and hydrogen process gas. For this plasma post-treatment, reactor conditions further included an RF power of about 250 Watts at a frequency of about 13.6 MHz. After a predetermined exposure time of about 1 minute, the reactor was evacuated.

Figure 3:
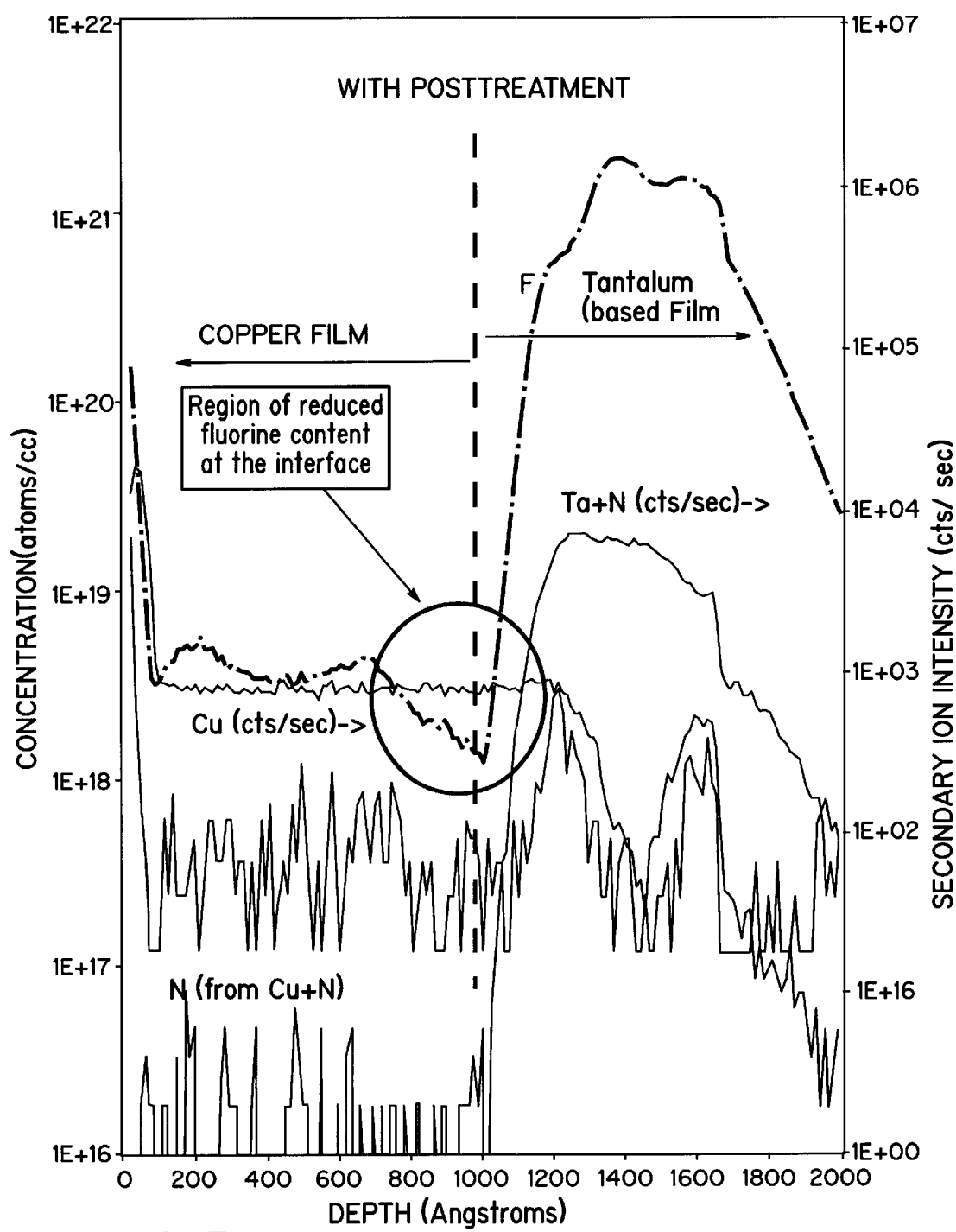
FIG. 3 is a SIMS depth profile of a copper layer deposited on a modulated tantalum/tantalum nitride film following an ammonia plasma post-treatment of the modulated film surface prior to copper deposition in accordance with the present invention.

FIG. 3 shows a SIMS elemental depth profile for this copper film deposited after the ammonia plasma post-treatment. Fluorine present in the copper layer is lower than that of FIG. 2, and at the copper/barrier interface, the fluorine level is 2–3 orders of magnitude lower than that of FIG. 2. The test device passed both the tape test and the scratch and tape test. The difference in adhesion performance between the comparative device and the test device can be attributed to the reduction in the residual fluorine level at the copper/barrier interface resulting from the plasma post-treatment of the present invention.

While the present invention has been illustrated by the description of an embodiment thereof, and while the embodiment has been described in considerable detail, it is not intended to restrict or in any way limit the scope of the appended claims to such detail. Additional advantages and modifications will readily appear to those skilled in the art. For example, a nitrogen-containing plasma post-treatment of a barrier layer of titanium nitride, titanium or other transition metal deposited by CVD using a transition metal halide vapor-phase reactant may reduce the effect of by-product halogen atoms upon the adhesion of a subsequently applied copper layer just as shown above with respect to tantalum and tantalum nitride. The invention in its broader aspects is therefore not limited to the specific details, representative apparatus and method and illustrative examples shown and described. Accordingly, departures may be made from such details without departing from the scope or spirit of applicant's general inventive concept.

What is claimed is:

1. A method for improving adhesion of a copper film to a transition metal based barrier layer, the method comprising:

depositing on a substrate a transition metal based barrier layer by chemical vapor deposition using a transition metal halide precursor whereby halogen impurity atoms are generated in the barrier layer;

exposing the deposited barrier layer to a plasma of a nitrogen-containing gas to thereby reduce the content of halogen impurity atoms in the barrier layer; and thereafter depositing on the barrier layer a copper film by physical vapor deposition.

2. The method of claim 1, wherein the transition metal is tantalum.

3. The method of claim 1, wherein the transition metal is titanium.

4. The method of claim 1, wherein the transition metal is tungsten.

5. The method of claim 1, wherein the transition metal based barrier layer is a modulated Ta/TaN$_x$ barrier layer.

6. The method of claim 1, wherein the exposing is for a time between about 10 seconds and 600 seconds.

7. The method of claim 1, wherein the nitrogen-containing gas is selected from the group of ammonia, nitrogen, hydrazine, a mixture of hydrogen and nitrogen, and combinations thereof.

8. The method of claim 1, wherein the nitrogen-containing gas is ammonia.

9. The method of claim 1, wherein the depositing of the barrier layer by chemical vapor deposition includes chemically reacting the transition metal halide precursor in vapor phase with a reducing gas.

10. The method of claim 9, wherein the transition metal halide is selected from the group of tantalum pentafluoride, tantalum pentachloride, tantalum pentabromide, and combinations thereof.

11. The method of claim 9, wherein the reducing gas is first a hydrogen gas for depositing tantalum, and second is a nitrogen-containing and hydrogen-containing gas for depositing tantalum nitride to form a modulated Ta/TaN$_x$ barrier layer.

12. A method for improving adhesion of a copper film to a transition metal based barrier layer, the method comprising:

depositing a layer of a transition metal based material by a CVD process onto a surface of a dielectric-covered substrate via a chemical reaction between a transition metal halide in vapor phase and a reducing gas, wherein by-product halogen atoms are created by the chemical reaction and incorporated into the deposited layer;

providing a gas atmosphere comprising a nitrogen-containing and hydrogen-containing process gas adjacent a surface of the deposited barrier layer;

creating a plasma from the gas atmosphere;

exposing the deposited barrier layer to the plasma for a predetermined time sufficient to react the plasma with the halogen atoms; and thereafter depositing a copper layer onto the barrier layer by physical vapor deposition.

13. The method of claim 12, wherein the providing, creating and exposing include heating the substrate to a temperature between about 150° C. and about 500° C.

14. The method of claim 12, wherein the transition metal is tantalum.

15. The method of claim 12, wherein the transition metal is titanium.

16. The method of claim 12, wherein the transition metal is tungsten.

17. The method of claim 12, wherein the transition metal based barrier layer is a modulated Ta/TaN$_x$ barrier layer.

18. The method of claim 12, wherein the transition metal halide is selected from the group of tantalum pentafluoride, tantalum pentachloride, tantalum pentabromide, and combinations thereof.

19. The method of claim 12, wherein the nitrogen-containing and hydrogen-containing process gas is selected from the group of ammonia, hydrazine, a mixture of hydrogen and nitrogen, a mixture of ammonia and hydrogen, and combinations thereof.

20. The method of claim 12, wherein the predetermined time is between about 10 seconds and about 600 seconds.

21. The method of claim 20, wherein the predetermined time is about 60 seconds.

22. A method for improving adhesion of a copper film to a tantalum/tantalum nitride barrier layer, the method comprising:

depositing a modulated Ta/TaN$_x$ barrier layer by a CVD process onto a surface of a dielectric-covered substrate via a chemical reaction between a tantalum halide vapor-phase reactant and a reducing gas, wherein by-product halogen atoms are created by the chemical reaction and incorporated into the deposited barrier layer;

providing ammonia gas adjacent a surface of the deposited barrier layer;

creating a plasma from the ammonia gas;

exposing the deposited barrier layer to the plasma for a predetermined time sufficient to react the ammonia plasma with the halogen atoms; and thereafter depositing a copper layer onto the barrier layer by physical vapor deposition.

23. The method of claim 22, wherein the providing, creating and exposing include heating the substrate to a temperature between about 150° C. and about 500° C.

24. The method of claim 22, wherein the tantalum halide is selected from the group of tantalum pentafluoride, tantalum pentachloride, tantalum pentabromide, and combinations thereof.

25. The method of claim 22, wherein the predetermined time is between about 10 seconds and about 600 seconds.

26. The method of claim 25, wherein the predetermined time is about 60 seconds.

* * * * *

UNITED STATES PATENT AND TRADEMARK OFFICE
CERTIFICATE OF CORRECTION

PATENT NO.   : 6,455,414 B1
DATED        : September 24, 2002
INVENTOR(S)  : Hillman et al.

It is certified that error appears in the above-identified patent and that said Letters Patent is hereby corrected as shown below:

Column 4,
Line 42, reads "Tort." and should read -- Torr. --.
Line 59, reads "which. is" and should read -- which is --.

Column 7,
Line 41, reads "H2." and should read -- $H_2$. --.

Signed and Sealed this

Eighteenth Day of March, 2003

JAMES E. ROGAN
*Director of the United States Patent and Trademark Office*